United States Patent [19]
Epstein et al.

[11] 4,021,834
[45] May 3, 1977

[54] RADIATION-RESISTANT INTEGRATED OPTICAL SIGNAL COMMUNICATING DEVICE

[75] Inventors: Arnold S. Epstein, Washington, D.C.; Stewart Share, Brookeville; Roland A. Polimadei, Rockville, both of Md.

[73] Assignee: The United States of America as represented by the Secretary of the Army, Washington, D.C.

[22] Filed: Dec. 31, 1975

[21] Appl. No.: 645,745

[52] U.S. Cl. .................................. 357/19; 357/17; 250/551; 250/199
[51] Int. Cl.² .......................................... H01L 31/12
[58] Field of Search ............... 357/19, 17; 250/551, 250/191

[56] References Cited

UNITED STATES PATENTS

| | | | |
|---|---|---|---|
| 3,881,113 | 4/1975 | Rideont | 250/551 |
| 3,914,137 | 10/1975 | Huffman | 148/175 |
| 3,958,265 | 5/1976 | Charmakadze | 357/17 |
| 3,962,714 | 6/1976 | King | 357/19 |
| 3,975,751 | 8/1976 | Springthorpe | 357/19 |
| 3,979,587 | 9/1976 | de Cremoux | 250/211 J |

*Primary Examiner*—Martin H. Edlow
*Attorney, Agent, or Firm*—Nathan Edelberg; Robert P. Gibson; Saul Elbaum

[57] ABSTRACT

An integrated optical signal communicating device associating an optical waveguide for guiding a light wave with a light-emitting junction for emitting the light wave and a light-collecting junction for receiving at least a part of the light wave. The device utilizes the gallium aluminum arsenide alloy system in the fabrication of the waveguide, emitter and collector to produce a device with high radiation resistance.

10 Claims, 3 Drawing Figures

RADIATION-RESISTANT INTEGRATED OPTICAL SIGNAL COMMUNICATING DEVICE

RIGHTS OF THE GOVERNMENT

The invention described herein may be manufactured, used and licensed by and for the U.S. Government for governmental purposes without the payment to us of any royalty thereon.

BACKGROUND OF THE INVENTION

Field of the Invention

The present invention relates generally to integrated optical signal communicating devices utilizing semiconductor bodies and more particularly to such devices capable of maintaining optimum light communication capability after exposure to ionizing and neutron radiation.

Description of the Prior Art

The field of integrated optics or thin-film optoelectronics —thin film optical devices so small that they can be placed one next to the other on a single substrate-offers great promise in signal processing and communication. Active optical systems have been proposed requiring monolithic integration of a semiconductor light-generating device, such as an electroluminescent diode or laser, a waveguide, a detector and perhaps a modulator on the same clip. Much research in optical-component integration involves development of fabrication techniques for gallium arsenide, since it is most suitable for electro-luminescent diodes and photo detectors, and the large electro-optic effect in gallium arsenide allows efficient phase modulation of gallium arsenide thin films used as waveguides.

However, the electro-optical characteristics of gallium arsenide, such as quantum or light-emitting efficiency, absorption coefficients, and index of refraction are degraded by the ionization which occurs under the influence of gamma and neutron radiation. In order to prevent too great an impairment of the function of circuits equipped with gallium arsenide integrated optical signal communicating devices in their application, say, in earth satellites and space vehicles, the devices should have a radiation resistance, i.e., radiation hardening, as high as possible.

BRIEF SUMMARY OF THE INVENTION

It is therefore one object of the present invention to provide a radiation-hardened semiconductor integrated optical signal communicating device.

It is another object of the present invention to provide such a device capable of maintaining optimum light communication capability after exposure to ionizing and displacement radiation.

The objects of the present invention are achieved by an integrated device associating an optical waveguide for guiding a light wave with a light-emitting junction for emitting the light wave and a light-collecting junction for receiving at least a part of the light wave. The device utilizes the gallium aluminum arsenide alloy system in the fabrication of the wave guide, emitter and collector to produce a device with high radiation resistance. The device comprises an N+type gallium arsenide substrate having a doping level of $10^{18}$ atoms/cm$^3$, coated with an optical waveguide film of $n$ $Ga_{1-y}Al_y$ As ($y$ ranging from 0.01 to 0.34) having a doping level of $10^{16}$ atoms/cm$^3$ and a refractive index greater than that of the substrate. The device further comprises first dielectric means for coupling light into the waveguide, second dielectric means for extracting light from the waveguide, a first pair of semiconductor regions of opposite conductivity in contact with the first dielectric means and defining the light-emitting junction, and a second pair of semiconductor regions of opposite conductivity in contact with the second dielectric means and defining the light-collecting junction, wherein the semiconductor is $Ga_{1-x}Al_x$ As and x lies in the range 0.01 and 0.34. Means are provided for applying a bias to the light-emitting junction to inject charge carriers, thereby producing a recombination light wave which travels through the optical waveguide and, means are provided for applying a bias to the light-collecting junction to collect the charge carriers which are generated by absorption of the light wave at the light-collecting junction.

The foregoing as well as other objects, features and advantages of the present invention will become more apparent from the following detailed description taken in conjunction with the appended drawings.

DETAILED DESCRIPTION OF THE PREFERRED EMBODIMENTS

Figure 1:
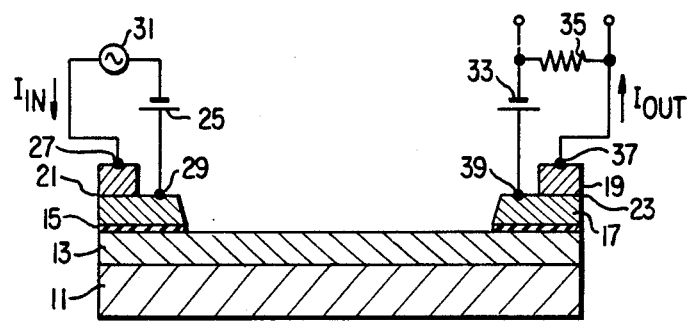
FIG. 1 is a schematic diagram of a first embodiment of the integrated optical signal communicating device in accordance with the present invention, shown connected in a circuit.

Referring now to the drawings, wherein like reference numerals designate identical elements, and more particularly to FIG. 1 thereof, a schematic diagram of a first embodiment of an integrated optical signal communicating device of this invention is shown. The device comprises a flat substrate of n$^+$-type conductivity gallium arsenide (GaAs) 11 upon which is grown a waveguiding film 13 of n type conductivity gallium aluminum arsenide ($Ga_{1-x}Al_x$As) by a conventional technique such as liquid epitaxial growth. The waveguiding film 13 is coated with a thin dielectric layer of light-transparent material 15 such as SiO$_2$. The dielectric layer has built on it a pair of opposite conductivity gallium aluminum arsenide ($Ga_{1-y}Al_y$ As) layers 17 and 19. Thereafter portions of the layers 17 and 19 are separated, and as much of the dielectric layer 15 therebetween removed by etching, for example, so as to define individual spaced-apart junctions 21 and 23, the junction 21 serving as the light-emitting and the junction 23 serving as the light-collecting junction. A fixed bias source, shown as a battery 25 is connected by terminals 27 and 29 to the opposite conductivity regions 17 and 19 so as to forward bias the light-emitting junction 21. A signal source 31 is imposed on the fixed bias 25 and is applied to the opposite conductivity regions 17 and 19. Another voltage source 33 is connected to provide a reverse bias for the light-collecting junction 23 and a resistor 35 is connected to this voltage source. The signal output is conventionally taken across the resistor 35. Terminals 37 and 39 are provided for applying the reverse bias to the light-collecting junction 23.

In operation of the device of FIG. 1, with forward bias imposed on the junction 21, injection of charge carriers occurs. Recombination radiation, i.e., recombination of holes and electrons producing photons, then takes place within the device at or near the light-emitting junction 21. The emitted light is coupled by the adjacent portion of the transparent dielectric layer 15 into the waveguiding film 13. The dielectric which makes up the layer 15 is thin, permits light to pass easily into the waveguiding film 13 with negligible absorption and permits electrical isolation of the emitter from the waveguiding film. It is known that for the waveguiding film to support progagating optical modes and to act as a waveguide for light waves, its refractive index $n_2$ must be greater than the refractive index $n_3$ of the substrate 11. Both the indices are assumed to be greater than the refractive index $n_1$ of the air space above the device. $n_2$ can be made to exceed $n_3$ by (1) properly controlling the doping concentration of the waveguiding film and the substrate and (2) the alloying of the waveguiding film with aluminum. It is known that the difference in index of refraction $\Delta n$ that can be controlled by alloying of aluminum into GaAs is given by $\Delta n \approx -0.4x$ where $x$ is the concentration of aluminum in the alloy $Ga_{1-x}Al_xAs$. When the light rays transmitted by the waveguiding film arrive at the interface between the waveguiding film and the remote portion of the dielectric layer 15, they are transmitted to the collector and the light energy passes to the light-collecting junction 23. The photons are absorbed upon striking the reverse-biased light-collecting junction and are converted into charge carriers. Due to this conversion into charge carriers, there is an increase of current in the output circuit as indicated by the arrow $I_{out}$.

Since the fabrication of the materials of the device form no part of the present invention, and methods of fabrication are known to those skilled in the art, a detailed discussion thereof is omitted for the sake of brevity (See, for example, U.S. Pat. No. 3,881,113 in the name of V. Rideout and J. Woodall and issued Apr. 29, 1975).

Figure 2:
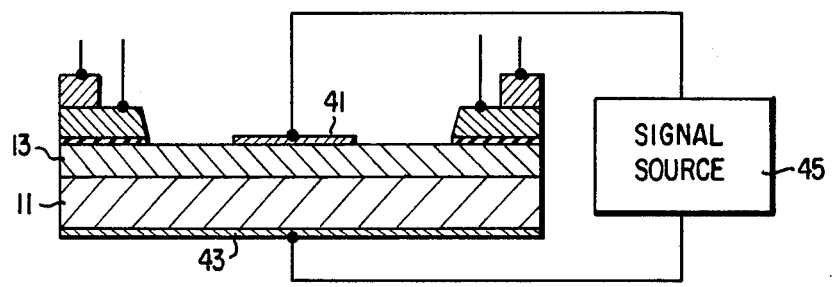
FIG. 2 is a schematic diagram of a second embodiment of an integrated optical signal communicating device of this invention.

An integrated optical device of the type shown in FIG. 1 can include an electro-optical modulator. Referring to FIG. 2, this is achieved in a second embodiment by placing a metallic electrode 41 on the top surface of the waveguiding film and a second metallic electrode 43 on the bottom face of the substrate 11, and applying a modulating signal source 45 therebetween. Such electrode means are capable of functioning as an efficient wide band phase modulator which alters the phase between components of the light wave traveling along the waveguiding film 13, and are well known in the art (See, for example U.S. Pat. No. 3,877,781 in the name of I. P. Kaminow and issued Apr. 15, 1975).

The following considerations have been taken into account in the design of the integrated optical device of FIGS. 1 and 2.

Our experiments have shown that the light-emitting or quantum efficiency of semiconductor gallium arsenide light-emitting junctions is considerably impaired for $^{60}$Co (gamma) irradiation dosages above $10^6$ rads (R.A. Polimadei, S. Share, A.S. Epstein, R. J. Lynch and D. Sullivan, IEEE Trans. Nuclear Science N.S. -21(1974)). The addition of aluminum as a cation substituent to gallium arsenide produces, by alloying, a substitutional solid solution of the same lattice type as the original compositions. Our experiments show that these alloys exhibit an improved radiation hardness relative to that of the gallium arsenide light-emitting junction. As a function of total dose to $10^8$ rads, the greatest relative degradation in quantum efficiency occurs for gallium arsenide (0% aluminum) while the least degradation occurs for the highest alloy compositions studied (34% aluminum). Alloying with as little as 1% aluminum improves the radiation hardness by more than a factor of 10. In addition to changes in efficiency with gamma irradiation, there occur shifts in peak wavelength toward shorter wavelengths. Similar effects are noted with neutron irradiation (see reference of R.A. Polemadei et al.).

Consequently, in the construction of the disclosed device, opposite conductivity $Ga_{1-y}Al_yAs$ layers can be chosen where y ranges from 0.01 to 0,34 to affect radiation hardening of a suitably matched (i.e., having the same composition) light-emitting junction and light-collecting junction. The composition $Ga_{99}Al_{01}As$ is most desirable because it is compatible with process fabrication techniques (e.g., liquid epitaxial growth) and does not involve a large change in lattice constants.

The prime consideration in the design of the waveguiding film is the effect of $^{60}$Co(gamma) irradiation dosages on the refractive index $n_2$ of the waveguiding film, since $n_2$ must be greater than the indices of refraction of the media surrounding the waveguiding film to support propagating optical modes.

It can be shown that the refractive index varies in proportion to the damage constant of the waveguiding film according to formula (A):

$$n = \left( n_o - \frac{A}{1 + k_x D} \right)^{1/2} \quad (A)$$

where:
$n_0$ is the pre-irradiated refractive index,
$n$ is the post-irradiated refractive index,
$k_x$ is the damage coefficient,
D is the radiation dosage, and
A is a factor taking into account the initial carrier concentration of the waveguiding film.

Figure 3:
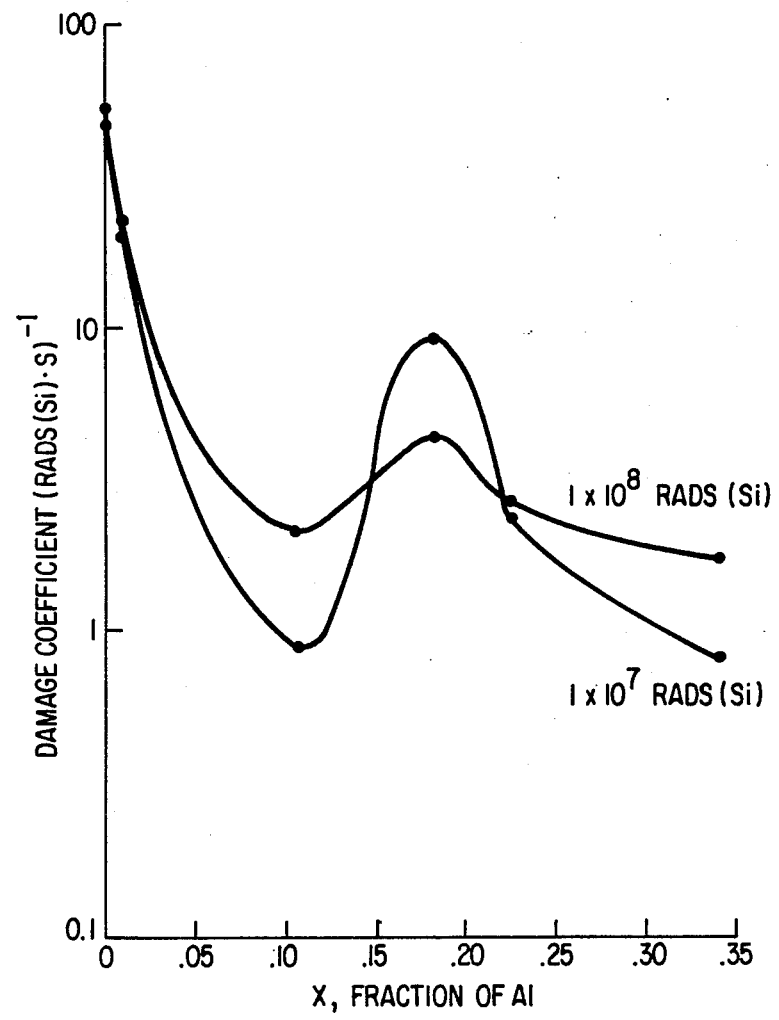
FIG. 3 is a graphical presentation of the damage coefficient for $Ga_{1-x}Al_x$As compositional alloys in the range 0–34% aluminum subjected to $^{60}$Co (gamma) irradiation dosages of $10^7$ and $10^8$ rads (Si).

Referring to FIG. 3, there is shown a graphical presentation of the damage coefficient as experimentally determined for $Ga_{1-x}Al_xAs$ compositional alloys in the range 0–34% aluminum subjected to $^{60}$Co(gamma) irradiation dosages of $10^7$ and $10^8$ rads. As a function of aluminum composition, the greatest damage occurs for the gallium arsenide sample (0% aluminum) while decreasing for samples having increasing aluminum content and passing through a minimum for a sample having 10% aluminum. Since the damage coefficient is greatest for the gallium arsenide sample (0% aluminum) the desired relationship $n_2 > n_3$ is maintained for the entire compositional range 0–34%. Consequently, in the construction of the disclosed device a gallium aluminum arsenide ($Ga_{1-x}Al_xAs$) waveguiding film can be chosen with $x$ ranging from 0.01 to 0.34 to effect radiation hardening, The composition $Ga_{0.90}Al_{0.10}As$ is most desirable because it is compatible with process fabrication techniques, introduces minimal lattice strain and is the least susceptible to radiation damage of the low aluminum concentratin alloys. For a given choice of compositional parameters, it is also preferable to select aluminum concentrations in the wave guiding film in excess of that used to effect radiation hardening of the light-emitting junction in order to minimize band-to-band energy losses in the waveguiding film.

Final consideration in the design of the integrated optical device of FIGS. 1 and 2 is the determination of the doping levels of the waveguide and substrate such that free carrier absorption losses of the optical wave are minimized within the waveguiding film upon exposure of the device to the radiation by a $^{60}$Co source. The mode attenuation constant (the absorption coefficient) of the waveguiding film is directly proportional to the free carrier concentration therein. With exposure to radiation, the free carrier concentration tends to decrease, reducing the free carrier absorption losses. This benefit is offset, however, by a concurrent decrease in the difference between the refractive indices of the waveguiding film and the substrate, $n_2 - n_3$, reducing the film's ability to support propagating optical modes. This latter effect cannot be avoided by initially selecting a high doping level, because then the absorption losses before and after exposure to irradiation will be intolerable. Optimal values of initial carrier concentration for the waveguiding layer and substrate can be determined to be of the order of $10^{16}$ atoms/cm$^3$ and $10^{18}$ atoms/cm$^3$ respectively, resulting in a loss of intensity due to free carrier absorption for a 1 mm length waveguide of less than 3%.

From the foregoing detailed description, it should therefore be apparent that all of the objectives set forth at the outset of the specification have been successfully achieved.

We wish it to be understood that we do not desire to be limited to the exact details of construction shown and described, for obvious modifications can be made by a person skilled in the art.

What is claimed as new and desired to be secured by letters patent of the United States is:

1. A radiation hardened integrated optical signal communicating device associating an optical waveguide for guiding a light wave with a light-emitting junction for emitting the light wave and a light-collecting junction for receiving at least a part of the light wave, and comprising:
   - a flat substrate of GaAs of $n^+$ conductivity type and a doping level of $10^{18}$ atoms/cm$^3$;
   - a film arranged upon one of the faces of said substrate, said film forming the waveguide and having a refractive index greater than that of said substrate, wherein said film is $Ga_{1-y}Al_yAs$, is of n conductivity type and has a doping level of $10^{16}$ atoms/cm$^3$ and y lies in the range 0.01 to 0.34;
   - first dielectric means for coupling light into the waveguide;
   - second dielectric means for extracting light from the wave guide;
   - a first pair of semiconductor regions of opposite conductivity in contact with said first dielectric means and defining the light-emitting junction;
   - a second pair of semiconductor regions of opposite conductivity in contact with said second dielectric means and defining the light-collecting junction;
   - wherein the semiconductor is $Ga_{1-x}Al_xAs$ and x lies in the range 0.01 to 0.034;
   - means for applying a bias to the light-emitting junction to inject charge carriers thereby producing a recombination light wave, the light wave traveling through the optical waveguide; and
   - means for applying a bias to the light-collecting junction to collect the charge carriers which are generated due to the absorption of the light wave at the light-collecting junction.

2. The radiation hardened integrated optical signal communicating device recited in claim 1 wherein: y is selected to be greater than x to reduce band-to-band absorption losses in the waveguide.

3. The radiation hardened integrated optical signal communicating device recited in claim 1 wherein: the dielectric is $SiO_2$.

4. The radiation hardened integrated optical signal communicating device recited in claim 1 including: an electro-optical modulator for altering the phase between components of the light wave traveling through the optical waveguide.

5. The radiation hardened integrated optical signal communicating device recited in claim 4 wherein: said electro-optical modulator includes a first metallic electrode on the top surface of the waveguide, and a second metallic electrode on the bottom face of the substrate.

6. The radiation hardened integrated optical signal communicating device recited in claim 1 wherein: x is 0.01.

7. The radiation hardened integrated optical signal communicating device recited in claim 1 wherein: y is 0.10.

8. The radiation hardened integrated optical signal communicating device recited in claim 1 wherein: y is 0.10 and x is 0.01.

9. The radiation hardened integrated optical signal communicating device recited in claim 8 wherein: the dielectric is $SiO_2$.

10. The radiation hardened integrated optical signal communicating device recited in claim 9 including: an electro-optical modulator for altering the phase between components of the light wave traveling through the optical waveguide.

* * * * *